(12) United States Patent
Yamamoto (10) Patent No.: US 12,191,213 B2
(45) Date of Patent: Jan. 7, 2025

(54) INSPECTION METHOD (71) Applicant: DISCO CORPORATION, Tokyo (JP)

(72) Inventor: Naoko Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 402 days.

(21) Appl. No.: 17/818,410

(22) Filed: Aug. 9, 2022

(65) Prior Publication Data

US 2023/0061146 A1 Mar. 2, 2023

(30) Foreign Application Priority Data

Aug. 30, 2021 (JP) .................................. 2021-140401

(51) Int. Cl.
*H01L 21/78* (2006.01)
*H01L 21/66* (2006.01)
*H01L 23/544* (2006.01)

(52) U.S. Cl.
CPC .......... *H01L 22/12* (2013.01); *H01L 21/7806* (2013.01); *H01L 21/78* (2013.01); *H01L 23/544* (2013.01); *H01L 2223/54493* (2013.01)

(58) Field of Classification Search
CPC ....... H01L 22/12; H01L 21/78; H01L 23/544; H01L 2223/54493
See application file for complete search history.

(56) References Cited

FOREIGN PATENT DOCUMENTS

JP 11017399 A 1/1999
JP 2008288423 A 11/2008

*Primary Examiner* — Zandra V Smith
*Assistant Examiner* — Molly K Reida
(74) *Attorney, Agent, or Firm* — Greer Burns & Crain Ltd.

(57) ABSTRACT

An inspection method for a divided wafer includes a wafer lamination step of stacking a transfer wafer on top of a wafer that has been divided into a plurality of chips, a particle transfer step of, after the wafer lamination step is carried out, positioning the transfer wafer on a lower side and the divided wafer on an upper side and applying a vibration to the wafer stacked on the transfer wafer, to drop particles adhering to side surfaces of the chips onto the transfer wafer, and an inspection step of, after the particle transfer step is carried out, inspecting the particles on the transfer wafer.

3 Claims, 6 Drawing Sheets

INSPECTION METHOD

BACKGROUND OF THE INVENTION

Field of the Invention

The present invention relates to an inspection method for a divided wafer.

Description of the Related Art

In a semiconductor device chip manufacturing process, a plurality of semiconductor devices are formed on a wafer, and the wafer is then divided into individual pieces by using a cutting apparatus or a laser processing apparatus, thereby manufacturing a plurality of semiconductor devices.

In the division of the wafer into individual pieces by a cutting blade, particles such as cutting swarf are generated upon cutting of the wafer. In addition, in the case where modified layers are formed by applying an laser beam to the wafer and an external force is then exerted on the wafer to divide the wafer into individual pieces, particles are generated at the time of dividing the wafer.

In the case where these particles are left on the wafer, performance of the devices is deteriorated. In addition, in the case where the particles adhere to electrodes, a bonding failure is caused in a later bonding step. Therefore, it is important to reduce adhesion of the particles, and in regard to investigation or evaluation for reducing the adhesion of the particles, a method of detecting the particles on the wafer has been proposed (see, for example, Japanese Patent Laid-open No. Hei 11-17399 and Japanese Patent Laid-open No. 2008-288423).

SUMMARY OF THE INVENTION

Meanwhile, the semiconductor devices obtained by dividing the wafer into chips are picked up from the wafer and subjected to mounting or packaging. The particles that have been generated at the time of division of the wafer into individual pieces and that adhere to side surfaces of the chips may drop at the time of picking-up or mounting, possibly causing a bonding failure.

Conventionally, the particles present on the side surfaces of the semiconductor devices in the chip form have not been evaluated. In recent years, with further miniaturization of electrodes and high integration of devices, however, there has been a desire to evaluate the side surfaces of the divided wafer.

In recent years, the semiconductor devices have been reduced in size, and the size of electrodes and the interval between the electrodes have also become finer. In order to achieve higher integration, there has also been examined a method of bonding semiconductor wafers together not through projected electrodes (bumps) but through flat-formed electrodes to manufacture a laminated device. In the case where surfaces of wafers are bonded together in such a manner as described above, the presence of particles on the surfaces of the wafers may possibly cause a bonding failure, and therefore, it is demanded that particles be controlled strictly compared with the related art.

Accordingly, it is an object of the present invention to provide an inspection method by which side surfaces of pieces divided from a wafer can be inspected.

In accordance with an aspect of the present invention, there is provided an inspection method for a divided wafer, the inspection method including a wafer lamination step of stacking a transfer wafer on top of a wafer that has been divided into a plurality of pieces, a particle transfer step of, after the wafer lamination step is carried out, positioning the transfer wafer on a lower side and the divided wafer on an upper side and applying a vibration to the wafer stacked on the transfer wafer, to drop particles adhering to side surfaces of the divided pieces onto the transfer wafer, and an inspection step of, after the particle transfer step is carried out, inspecting the particles on the transfer wafer.

Preferably, at least any of positions, the number, and size of the particles on the transfer wafer is inspected in the inspection step.

Preferably, the wafer and the transfer wafer each have a mark indicating a crystal orientation, the wafer and the transfer wafer are stacked on top of each other with the marks of the wafer and the transfer wafer as references in the wafer lamination step, and the mark of the transfer wafer is used as a reference in the inspection step.

The present invention has an effect that side surfaces of pieces divided from a wafer can be inspected.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below referring to the drawings. The present invention is not to be limited by the contents described in the following embodiment. In addition, the constituent elements described below include those which can easily be conceived by a person skilled in the art and those which are substantially the same. Further, the configurations described below can be combined appropriately. Besides, various kinds of omissions, replacement, or modifications of the configuration can be performed in such ranges as not to depart from the gist of the present invention.

Figure 1:
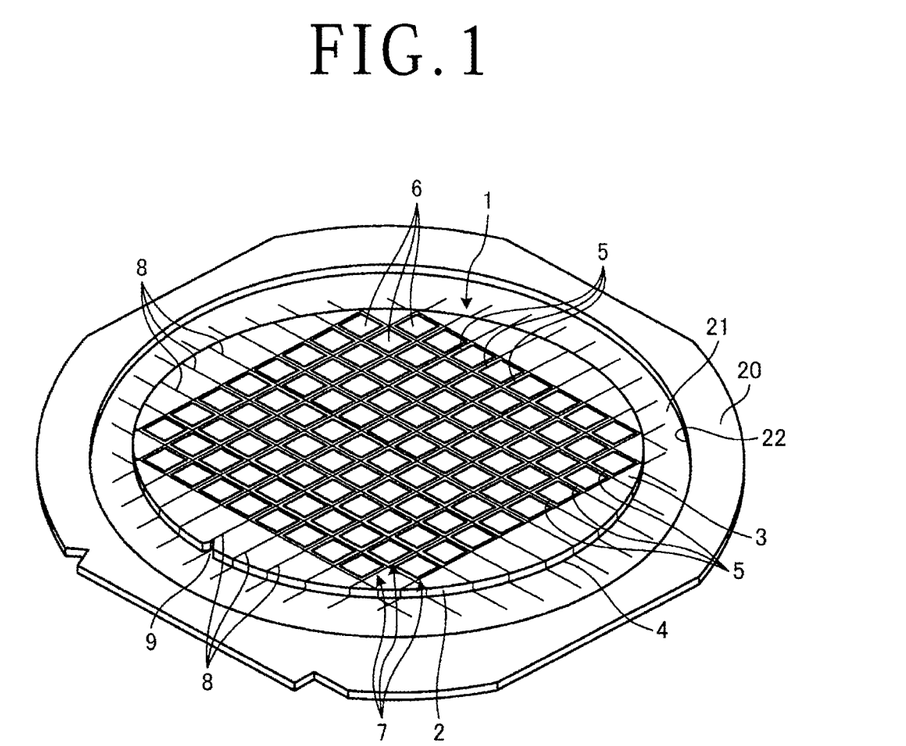
FIG. 1 is a perspective view of a wafer divided into chips, the wafer being an object to be inspected by an inspection method according to an embodiment.
Figure 2:
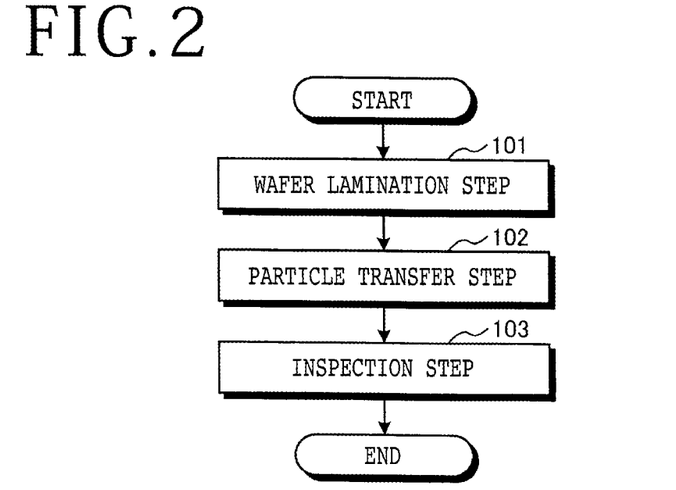
FIG. 2 is a flow chart depicting the flow of the inspection method according to the present embodiment.

An inspection method according to an embodiment of the present invention will be described on the basis of the drawings. FIG. 1 is a perspective view of a wafer divided into chips, the wafer being an object to be inspected by the inspection method according to the embodiment. FIG. 2 is a flow chart depicting the flow of the inspection method according to the embodiment.

(Wafer)

The inspection method according to the embodiment is an inspection method for the wafer 1 depicted in FIG. 1. The wafer 1 as an object to be inspected by the inspection method according to the embodiment is, for example, a disk-shaped semiconductor wafer or optical device wafer using silicon, sapphire, gallium arsenide, silicon carbide (SiC), or the like as a substrate 2. The wafer 1 is a disk-shaped wafer and has a front surface 3 and a back surface 4 positioned opposite the front surface 3, the front surface 3 and the back surface 4 being parallel to each other. The wafer 1 has a plurality of intersecting streets 5 set on the front surface 3, and devices 6 are formed in respective regions partitioned in grid form by the streets 5.

In the embodiment, the device 6 is, for example, an integrated circuit such as an integrated circuit (IC) or a large scale integration (LSI) circuit, or any of various memories (semiconductor storage devices). In addition, in the embodiment, the device 6 has an electrode (not illustrated) for being electrically connected to an electrode of a substrate on which the device 6 is mounted, or to an electrode of another device 6. The electrodes of the devices 6 are manufactured by the same manufacturing method as conductor patterns constituting the integrated circuits or various memories, and are formed to be flat.

In addition, the wafer 1 is divided along the streets 5 into chips 7 which are individual divided pieces. In other words, the wafer 1 has division grooves 8 which penetrate the wafer 1 itself and are formed between the chips 7. Note that the chip 7 includes a part of the substrate 2 and the device 6, and has the front surface 3, the back surface 4, and a plurality of side surfaces continuous with the front surface 3 and the back surface 4. Note that parts of the wafer 1 and the chip 7 which are the same are denoted by the same reference character in description. The side surfaces of the chip 7 are also inner surfaces of the division grooves 8.

In the embodiment, the wafer 1 is divided into the chips 7 by applying a laser beam to the wafer 1 along the streets 5 to form modified layers therein and breaking the wafer 1 with the modified layers as starting points. However, in the present invention, ablation processing may be conducted by applying a laser beam of such a wavelength as to be absorbed by the substrate 2 to the wafer 1 along the streets 5, or cutting may be conducted by making a cutting blade cut into the wafer 1 along the streets 5, and after grooves are formed along the streets 5 by the ablation processing or the cutting, grinding may be applied to the back surface 4 to divide the wafer 1 into individual chips 7.

Note that the modified layer means a region in which density, a refractive index, mechanical strength, or other physical property is different from that in the surroundings, and examples of such a region include a melting treatment region, a crack region, a dielectric breakdown region, a refractive index change region, and a region in which these regions are mixedly present. The modified layer is lower in mechanical strength than the other part in the substrate 2.

The back surface 4 of the wafer 1 is attached to a disk-shaped tape 21 with an annular frame 20 attached to an outer edge part of the tape 21, and the wafer 1 is supported in an opening 22 inside the annular frame 20. Note that the outside diameter of the tape 21 and the inner diameter of the annular frame 20 are greater than the outside diameter of the wafer 1. When the wafer 1 is divided into individual chips 7, particles 10 (depicted in FIG. 7 and the like) are produced. Besides, the wafer 1 has a mark 9 indicating the crystal orientation. In the embodiment, the mark 9 is a notch formed by cutting out the outer edge of the wafer 1 in reverse V shape, but the mark 9 is not limited to the notch in the present invention.

In addition, in the embodiment, the wafer 1 is divided into the individual chips 7, but the wafer may be divided into at least two pieces in the present invention. In this case, the wafer 1 may not be formed with the devices 6 on the front surface 3 thereof.

(Inspection Method)

The inspection method according to the embodiment is an inspection method for counting the number of particles adhering to the wafer 1. The inspection method is used, for example, for selecting processing conditions where a reduced number of particles are produced, for example, at the time of selection of processing conditions for dividing the wafer 1 into individual chips 7. As depicted in FIG. 2, the inspection method according to the embodiment includes a wafer lamination step 101, a particle transfer step 102, and an inspection step 103.

(Wafer Lamination Step)

Figure 3:
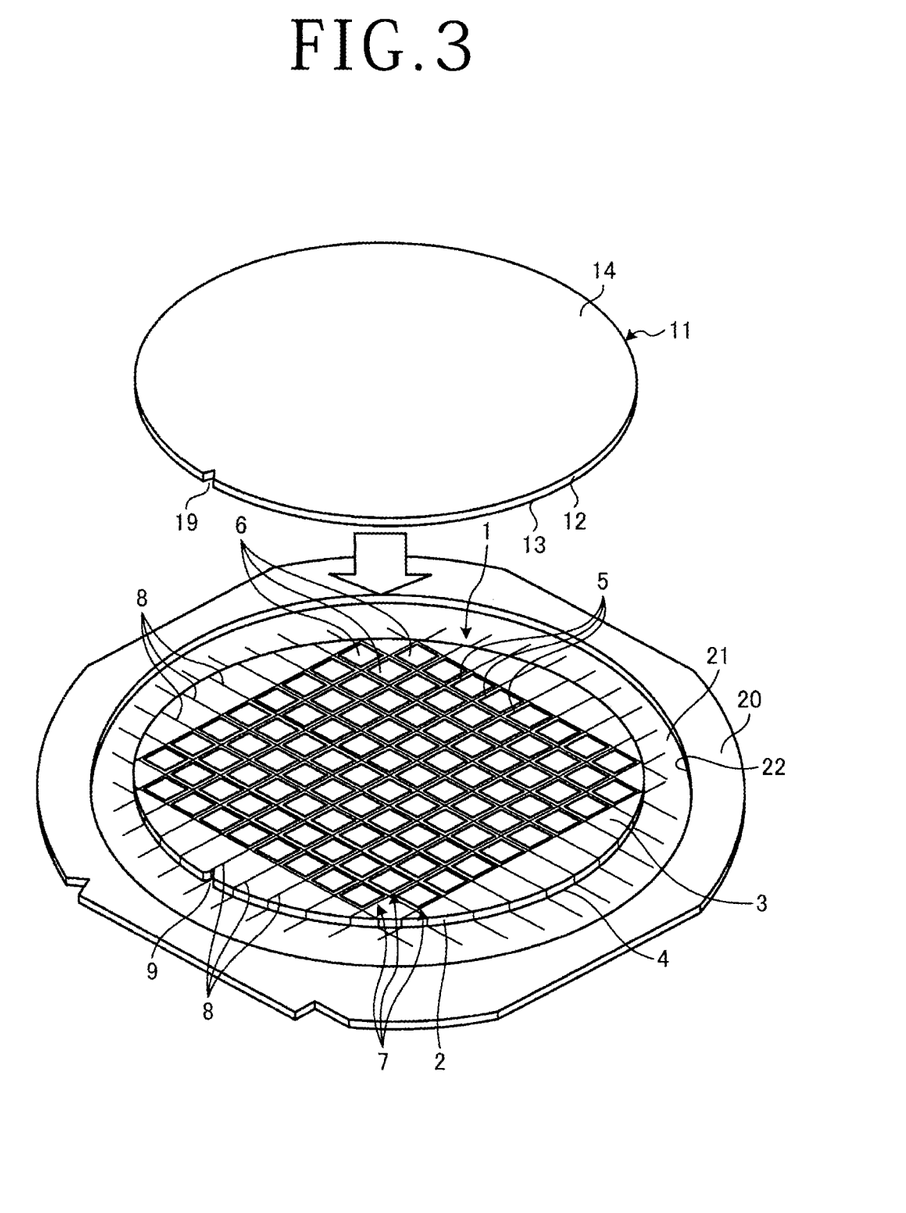
FIG. 3 is a perspective view schematically depicting a wafer lamination step of the inspection method depicted in FIG. 2.

FIG. 3 is a perspective view schematically depicting the wafer lamination step of the inspection method depicted in FIG. 2. The wafer lamination step 101 is a step of stacking a transfer wafer 11 on top of the wafer 1 that has been divided into a plurality of chips 7.

In the wafer lamination step 101, the transfer wafer 11 is stacked on the front surface 3 of the wafer 1 as depicted in FIG. 3. Note that the transfer wafer 11 is a wafer for which the number of adhering particles is controlled, such as a prime wafer or a wafer having an oxide film formed thereon. In the embodiment, the transfer wafer 11 is a prime wafer which has a front surface 13 and a back surface 14 positioned opposite the front surface 13 and which is formed in a disk shape using silicon, sapphire, gallium arsenide, SiC, or the like as a substrate 12.

In the embodiment, the outside diameter of the transfer wafer 11 is equal to the outside diameter of the wafer 1. The transfer wafer 11 has a mark 19 indicating the crystal orientation. In the embodiment, the mark 19 is a notch formed by cutting out the outer edge of the transfer wafer 11 in reverse V shape; however, in the present invention, the mark 19 is not limited to the notch. In the embodiment, the mark 19 of the transfer wafer 11 is the same in shape as the mark 9 of the wafer 1.

In the embodiment, in the wafer lamination step 101, the front surface 13 of the transfer wafer 11 is placed on the front surface 3 of the wafer 1, with the marks 9 and 19 of the wafer 1 and the transfer wafer 11 as references. In the embodiment, in the wafer lamination step 101, the wafer 1 and the transfer wafer 11 are arranged to match the marks 9 and 19 with each other.

(Particle Transfer Step)

Figure 4:
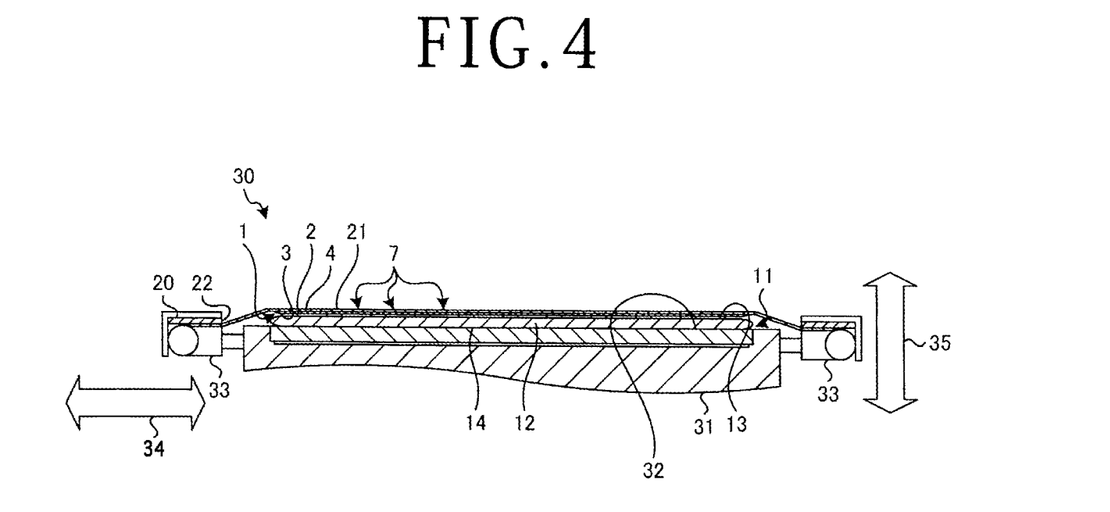
FIG. 4 is a side view schematically depicting, partly in section, a particle transfer step of the inspection method depicted in FIG. 2.
Figure 5:
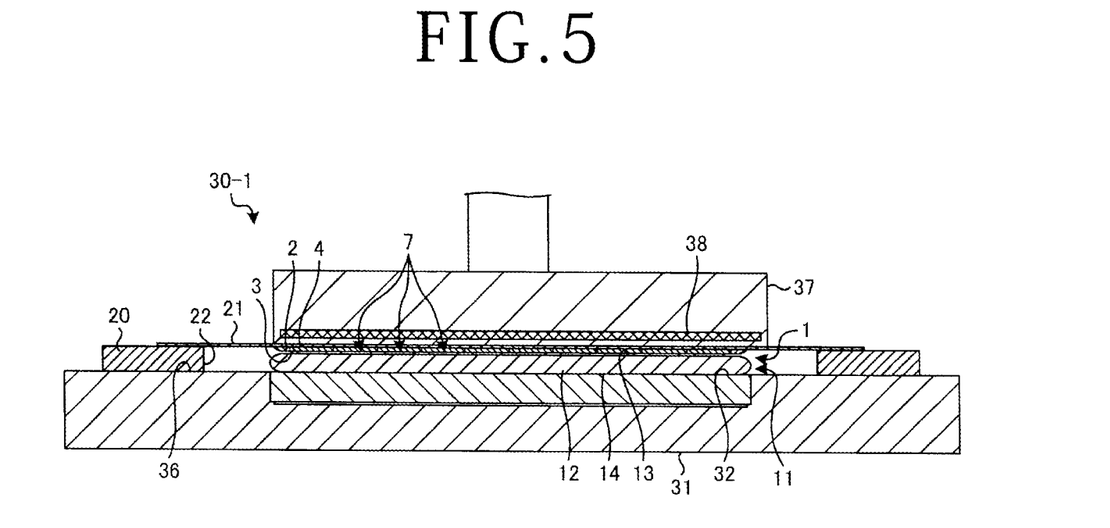
FIG. 5 is a side view schematically depicting, partly in section, a modification of the particle transfer step of the inspection method depicted in FIG. 2.

FIG. 4 is a side view schematically depicting, partly in section, the particle transfer step of the inspection method depicted in FIG. 2. FIG. 5 is a side view schematically depicting, partly in section, a modification of the particle transfer step of the inspection method depicted in FIG. 2. The particle transfer step 102 is a step of, after the wafer lamination step 101 is carried out, positioning the transfer wafer 11 on a lower side and the wafer 1 on an upper side and applying a vibration to the wafer 1 stacked on the transfer wafer 11, to drop the particles adhering to the side surfaces of the chips 7 onto the transfer wafer 11.

In the embodiment, in the particle transfer step 102, the wafer 1 is mounted on a holding surface 32 of a chuck table 31 of a transfer device 30 through the transfer wafer 11, as depicted in FIG. 4. In other words, the transfer wafer 11, which is stacked on top of the wafer 1 in the wafer lamination step 101, is mounted on the holding surface 32 of the chuck table 31 of the transfer device 30, and the wafer 1 is positioned on an upper side of the transfer wafer 11.

In the particle transfer step 102, the transfer device 30 holds the transfer wafer 11 under suction on the holding surface 32 of the chuck table 31, and the annular frame 20 is clamped between clamp parts 33 in the periphery of the chuck table 31. In the particle transfer step 102, the transfer device 30 vibrates the chuck table 31 in a direction 34 parallel to the holding surface 32 for a predetermined period of time, and vibrates the chuck table 31 also in a direction 35 orthogonal to the holding surface 32 for a predetermined period of time. In the particle transfer step 102, the transfer device 30 drops and transfers the particles 10 adhering to the front surface 3 of the wafer 1 onto the front surface 13 of the transfer wafer 11, and also drops and transfers the particles 10 adhering to the side surfaces of the individually divided chips 7 of the wafer 1 onto the front surface 13 of the transfer wafer 11.

In addition, in the present invention, in the particle transfer step 102, the wafer 1 may be mounted on a holding surface 32 of a chuck table 31 of a transfer device 30-1 through the transfer wafer 11, and the annular frame 20 may be mounted on a mount surface 36 flush with the holding surface 32, as depicted in FIG. 5. In this case, the transfer device 30-1 holds the transfer wafer 11 under suction on the holding surface 32 of the chuck table 31.

In the present invention, in the particle transfer step 102, the transfer device 30-1 lays a disk-shaped vibration applying member 37, the diameter of which is greater than the outside diameter of the wafer 1 but smaller than the inside diameter of the annular frame 20, on the back surface 4 of the wafer 1 through the tape 21. In the present invention, in the particle transfer step 102, the transfer device 30-1 applies electric power to an ultrasonic vibrator 38 inside the vibration applying member 37 for a predetermined period of time, thereby putting the ultrasonic vibrator 38 into an ultrasonic vibration (vibration at a frequency equivalent to the frequency of an ultrasonic wave). In the present invention, in the particle transfer step 102, the transfer device 30-1 may drop and transfer the particles 10 adhering to the front surface 3 of the wafer 1 onto the front surface 13 of the transfer wafer 11, and may also drop and transfer the particles 10 adhering to the side surfaces of the individually divided chips 7 of the wafer 1 onto the front surface 13 of the transfer wafer 11.

(Inspection Step)

Figure 6:
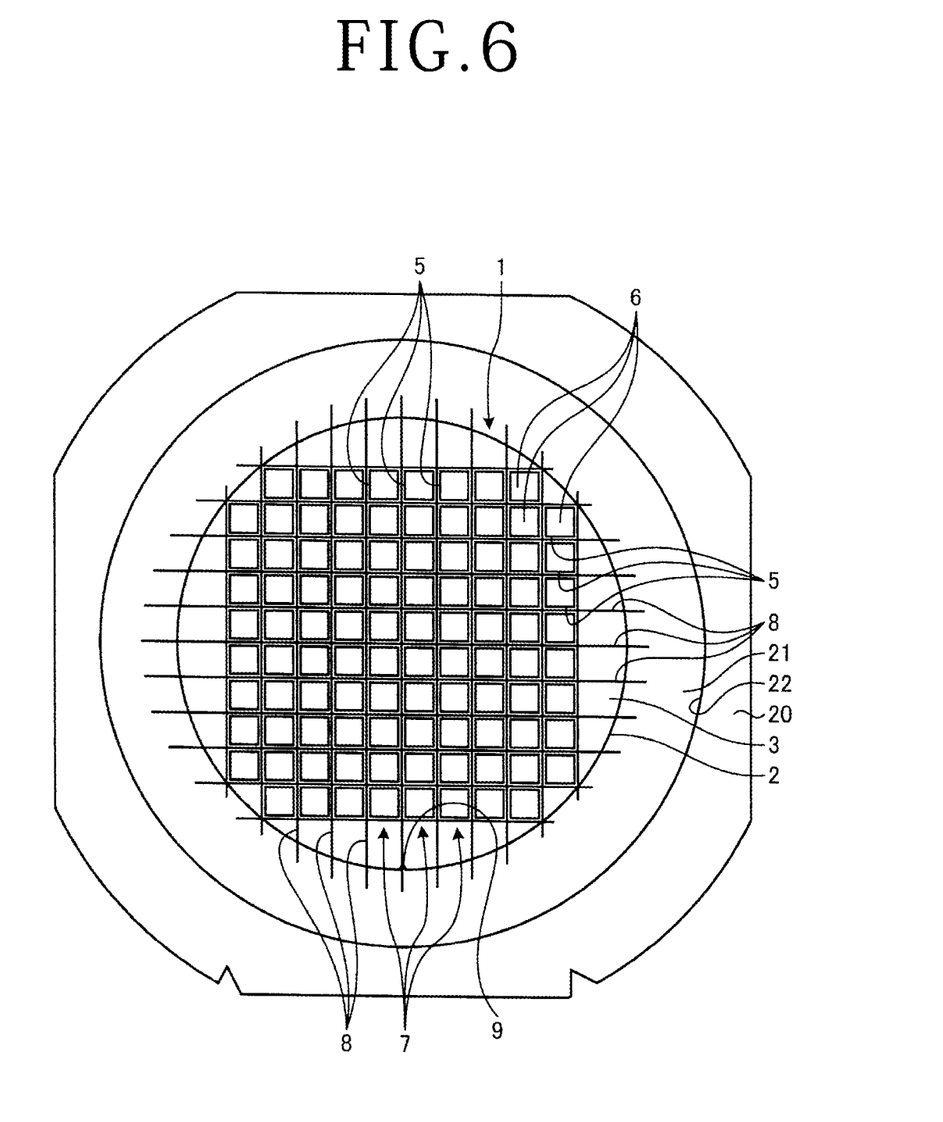
FIG. 6 is a plan view schematically depicting the wafer in an inspection step of the inspection method depicted in FIG. 2.
Figure 7:
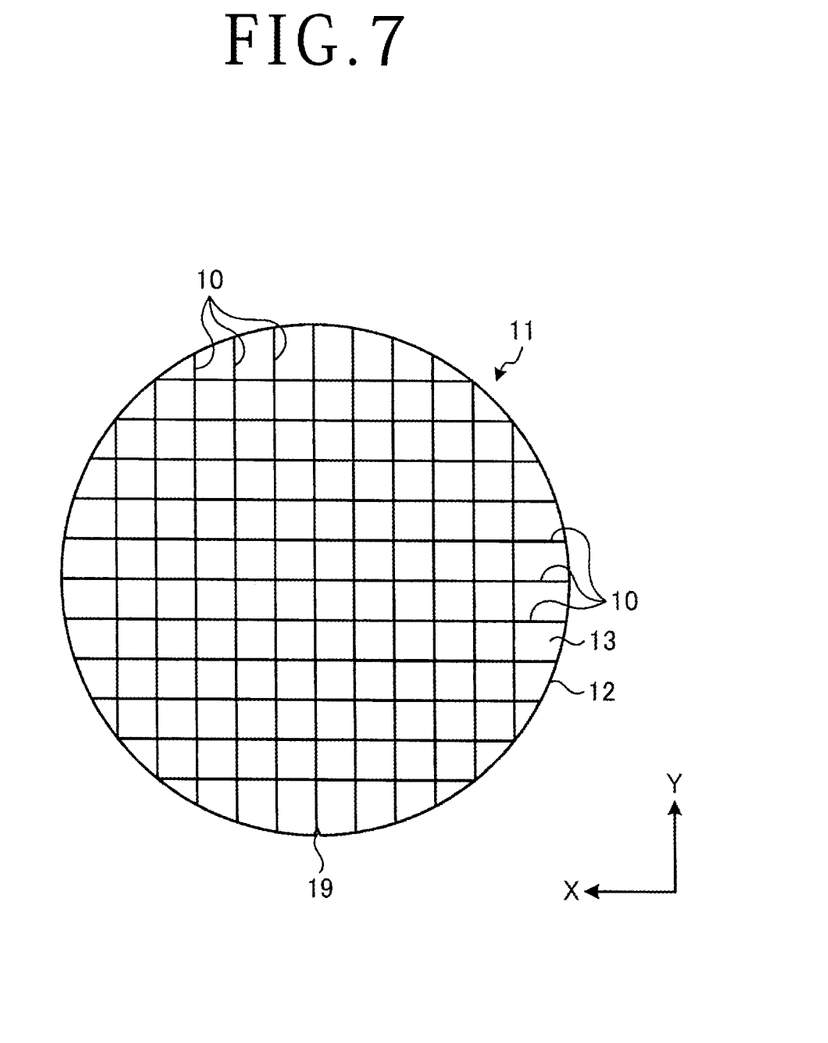
FIG. 7 is a plan view schematically depicting a transfer wafer in the inspection step of the inspection method depicted in FIG. 2.

FIG. 6 is a plan view schematically depicting the inspection step of the inspection method depicted in FIG. 2. FIG. 7 is a plan view schematically depicting the transfer wafer in the inspection step of the inspection method depicted in FIG. 2. The inspection step 103 is a step of inspecting the particles 10 on the transfer wafer 11, after the particle transfer step 102 is carried out.

In the embodiment, in the inspection step 103, the wafer 1 and the transfer wafer 11 stacked on top of each other are separated into the wafer 1 depicted in FIG. 6 and the transfer wafer 11 depicted in FIG. 7. In the transfer wafer 11 depicted in FIG. 7, the particles 10 dropped from the side surfaces of each chip 7, that is, the inner surfaces of the division grooves 8, adhere to the front surface 13, so that the particles 10 adhere to the front surface 13 at positions corresponding to the division grooves 8.

In the embodiment, in the inspection step 103, by use of a known particle counter, the position and size of each particle 10 on the front surface 13 of the transfer wafer 11 are detected, and the total number (corresponding to the number) of the particles 10 on the front surface 13 of the transfer wafer 11 is counted. Thus, in the embodiment, in the inspection step 103, the positions, the total number, and the size of the particles 10 on the front surface 13 of the transfer wafer 11 are inspected; however, in the present invention, it may suffice to inspect any of the positions, the total number, and the size of the particles 10.

In the embodiment, the position of the particle 10 detected in the inspection step 103 is defined by a distance in an X-axis direction and a distance in a Y-axis direction from the mark 19 of the transfer wafer 11, with the mark 19 as a reference position. Note that, in the embodiment, the X-axis direction is a direction parallel to the streets 5 extending in one direction among the streets 5 in a grid pattern, and the Y-axis direction is a direction parallel to the streets 5 extending in the other direction.

In addition, in FIG. 7, the particles 10 dropped from the side surfaces of each chip 7, that is, the inner surfaces of the division grooves 8, onto the front surface 13 of the transfer wafer 11 are illustrated, and other particles 10 are omitted. Thus, in the inspection step 103, the position of the particle 10 is defined with the mark 19 of the transfer wafer 11 as a reference.

In the inspection method according to the embodiment described above, the transfer wafer 11 is stacked on top of the divided wafer 1 in the wafer lamination step 101, and a vibration is applied to the divided wafer 1 in a state in which the transfer wafer 11 is positioned on a lower side in the particle transfer step 102. Therefore, in the inspection method according to the embodiment, the particles 10 adhering to the side surfaces of the chips 7 can be dropped onto the transfer wafer 11, so that the particles 10 on the divided wafer 1 can be transferred onto the transfer wafer 11.

Therefore, the inspection method according to the embodiment can evaluate the particles 10 having been adhering to the side surfaces of the chips 7, by inspecting the particles 10 on the front surface 13 of the transfer wafer 11 in the inspection step 103. As a result, the inspection method according to the embodiment produces an effect that it is possible to inspect the side surfaces of the chips 7 of the divided wafer 1.

Figure 8:
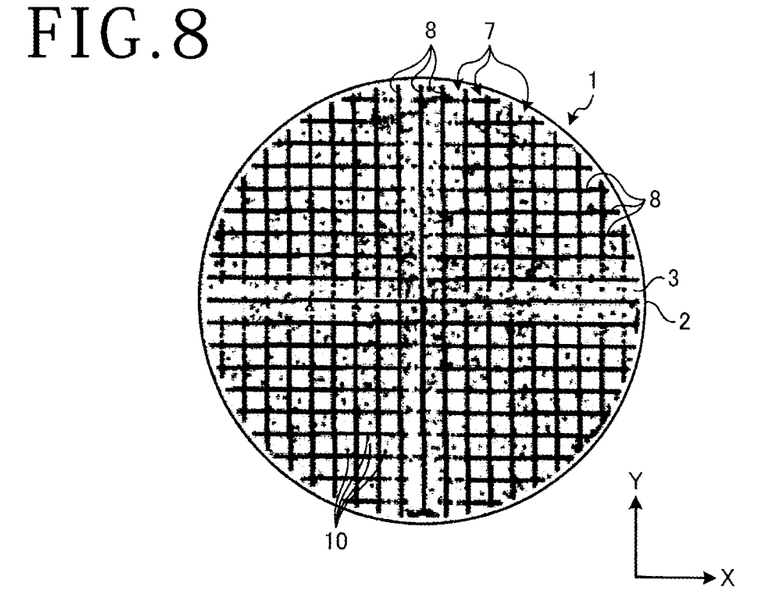
FIG. 8 is a plan view of the wafer for which the number of particles has been counted in checking an effect of the inspection method according to the present embodiment.
Figure 9:
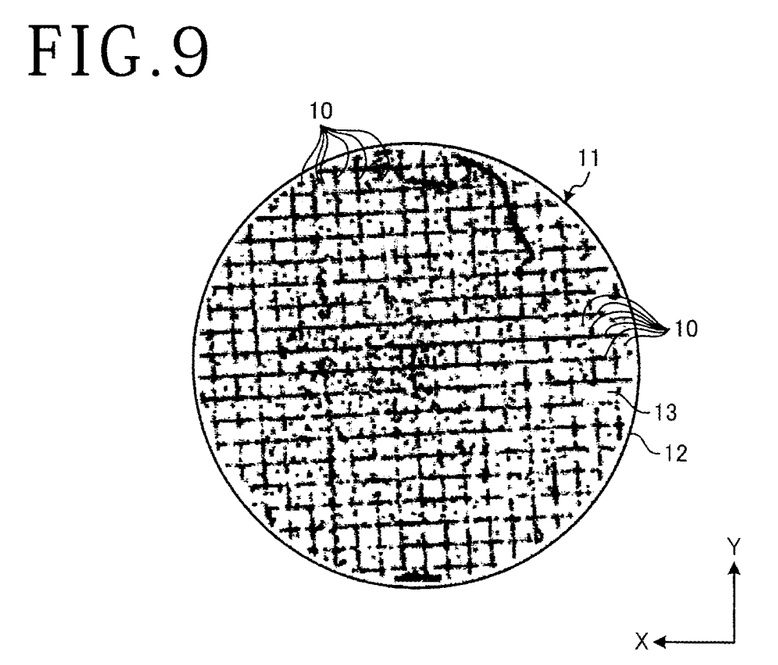
FIG. 9 is a plan view of the transfer wafer onto which the particles on the wafer depicted in FIG. 8 have been transferred by the inspection method according to the present embodiment.

Next, the inventor of the present invention checked the effect of the inspection method according to the embodiment. FIG. 8 is a plan view of the wafer for which the number of particles has been counted in checking the effect of the inspection method according to the embodiment. FIG. 9 is a plan view of the transfer wafer onto which the particles on the wafer depicted in FIG. 8 have been transferred by the inspection method according to the embodiment. Note that the marks 9 and 19 are omitted in FIGS. 8 and 9.

In checking the effect, by use of a known particle counter, the position and size of each particle 10 on the front surface 3 of the wafer 1 divided into the chips 7 depicted in FIG. 8 were detected, and the total number (corresponding to the number) of the particles 10 on the front surface 3 of the wafer 1 was counted. Next, the wafer lamination step 101 and the particle transfer step 102 of the inspection method according to the embodiment were carried out, and the particles 10 on the wafer 1 depicted in FIG. 8 were transferred onto the front surface 13 of the transfer wafer 11 depicted in FIG. 9. By use of a known particle counter, the position and size of each particle 10 on the front surface 13 of the transfer wafer 11 depicted in FIG. 9 were detected, and the total number (corresponding to the number) of the particles 10 on the front surface 13 of the transfer wafer 11 was counted.

On the front surface 13 of the transfer wafer 11 depicted in FIG. 9, the particles 10 adhered along the division grooves 8 of the wafer 1 depicted in FIG. 8. Therefore, according to the transfer wafer 11 depicted in FIG. 9, it has been made clear that the particles 10 adhering to the inner surfaces of the division grooves 8, that is, the side surfaces of the chips 7, can be transferred onto the transfer wafer 11 by stacking the transfer wafer 11 on top of the divided wafer 1 in the wafer lamination step 101 and applying a vibration to the divided wafer 1 in a state in which the transfer wafer 11 is positioned on a lower side in the particle transfer step 102. Thus, it has been made clear that the side surfaces of the chips 7 of the divided wafer 1 can be inspected.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An inspection method for a divided wafer, the inspection method comprising:
a wafer lamination step of stacking a transfer wafer on top of a wafer that has been divided into a plurality of pieces;
a particle transfer step of, after the wafer lamination step is carried out, positioning the transfer wafer on a lower side and the divided wafer on an upper side and applying a vibration to the wafer stacked on the transfer wafer, to drop particles adhering to side surfaces of the divided pieces onto the transfer wafer; and
an inspection step of, after the particle transfer step is carried out, inspecting the particles on the transfer wafer.

2. The inspection method according to claim 1, wherein at least any of positions, the number, and size of the particles on the transfer wafer is inspected in the inspection step.

3. The inspection method according to claim 1, wherein the wafer and the transfer wafer each have a mark indicating a crystal orientation,
the wafer and the transfer wafer are stacked on top of each other with the marks of the wafer and the transfer wafer as references in the wafer lamination step, and
the mark of the transfer wafer is used as a reference in the inspection step.

\* \* \* \* \*